US009887181B2

(12) United States Patent
Nakabayashi et al.

(10) Patent No.: US 9,887,181 B2
(45) Date of Patent: Feb. 6, 2018

(54) LIGHT EMITTING DEVICE

(71) Applicant: NICHIA CORPORATION, Anan-shi (JP)

(72) Inventors: Takuya Nakabayashi, Tokushima (JP); Tadaaki Ikeda, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/480,460

(22) Filed: Apr. 6, 2017

(65) Prior Publication Data
US 2017/0294419 A1    Oct. 12, 2017

(30) Foreign Application Priority Data

Apr. 6, 2016 (JP) ................. 2016-076787

(51) Int. Cl.
| | |
|---|---|
| *H01L 29/18* | (2006.01) |
| *H01L 33/00* | (2010.01) |
| *H01L 25/075* | (2006.01) |
| *H01L 33/60* | (2010.01) |
| *H01L 33/48* | (2010.01) |
| *H01L 33/50* | (2010.01) |
| *H01L 33/62* | (2010.01) |

(52) U.S. Cl.
CPC ........ *H01L 25/0753* (2013.01); *H01L 33/483* (2013.01); *H01L 33/502* (2013.01); *H01L 33/60* (2013.01); *H01L 33/62* (2013.01)

(58) Field of Classification Search
CPC ... H01L 25/0753; H01L 33/62; H01L 33/502; H01L 33/60; H01L 33/483
See application file for complete search history.

(56) References Cited

U.S. PATENT DOCUMENTS

| 2014/0362570 A1* | 12/2014 | Miyoshi .......... F21K 9/68 |
| | | 362/240 |
| 2015/0102366 A1 | 4/2015 | Wada |
| 2015/0263247 A1 | 9/2015 | Wada et al. |
| 2016/0155914 A1 | 6/2016 | Miki |

FOREIGN PATENT DOCUMENTS

| JP | 2014-132629 | 7/2014 |
| JP | 2014-236175 | 12/2014 |
| JP | 2015-012081 | 1/2015 |
| JP | 2015-053326 | 3/2015 |
| JP | 2015-079805 | 4/2015 |
| JP | 2015-177120 | 10/2015 |

* cited by examiner

*Primary Examiner* — Victor A Mandala
(74) *Attorney, Agent, or Firm* — Mori & Ward, LLP

(57) ABSTRACT

A light emitting device includes a first light emitting element having a first front surface and a first lateral surface, and a second light emitting element having a second front surface and a second lateral surface. A substrate includes a substrate front surface in which an intermediate wiring is provided. The light reflective covering member is provided on the substrate front surface to cover the first lateral surface and the second lateral surface. The light reflective covering member includes an external surface opposite to a substrate front surface in the front-back direction and a first recess having a recess opening on the external surface and a recess bottom opposite to the recess opening in the front-back direction. The recess bottom is positioned between the intermediate wiring and both of the first front surface and the second front surface in the front-back direction.

9 Claims, 4 Drawing Sheets

LIGHT EMITTING DEVICE

CROSS-REFERENCE TO RELATED PATENT APPLICATIONS

The present application claims priority under 35 U. S. C. § 119 to Japanese Patent Application No. 2016-076787, filed Apr. 6, 2016. The contents of this application are incorporated herein by reference in their entirety.

BACKGROUND OF THE INVENTION

Field of the Invention

The present disclosure relates to a light emitting device.

Discussion of the Background

For example, Japanese Unexamined Patent Application Publication No. 2015-079805 discloses a plurality of semiconductor light emitting elements disposed on a substrate spaced apart from each other, a transparent phosphor plate provided on each of the semiconductor light emitting elements, a transparent bonding member fixedly bonding upper surfaces of the semiconductor light emitting elements and lower surfaces of the phosphor plates respectively, and a reflective layer surrounding the semiconductor light emitting elements and the phosphor plates and containing light-reflective fine particles.

SUMMARY OF THE INVENTION

According to one aspect of the present invention, a light emitting device includes a first light emitting element, a second light emitting element, a substrate, and a light reflective covering member. The first light emitting element has a first front surface, a first back surface opposite to the first front surface in a front-back direction of the light emitting device, and a first lateral surface connecting the first front surface and the first back surface. The second light emitting element has a second front surface, a second back surface opposite to the second front surface in the front-back direction, and a second lateral surface connecting the second front surface and the second back surface. The substrate has a substrate front surface substantially perpendicular to the front-back direction. The substrate includes a first land, a second land, and an intermediate wiring. The first land is provided in the substrate front surface. The first light emitting element is mounted in a flip-chip configuration on the first land such that the first back surface faces the first land in the front-back direction. The second land is provided in the substrate front surface. The second light emitting element is mounted in a flip-chip configuration on the second land such that the second back surface is faces the second land in the front-back direction. The first land and the second land are arranged in an array direction on the substrate front surface. The intermediate wiring is provided between the first land and the second land in the substrate front surface to electrically connect the first land and the second land. The light reflective covering member is provided on the substrate front surface to cover the first lateral surfaces of the first light emitting element and the second lateral surface of the second light emitting element. The light reflective covering member includes an external surface opposite to the substrate front surface in the front-back direction and a first recess provided between the first light emitting element and the second light emitting element. The first recess has a recess opening on the external surface and a recess bottom opposite to the recess opening in the front-back direction. The recess bottom is positioned between the intermediate wiring and both of the first front surface of the first light emitting element and the second front surface of the second light emitting element in the front-back direction.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1A:
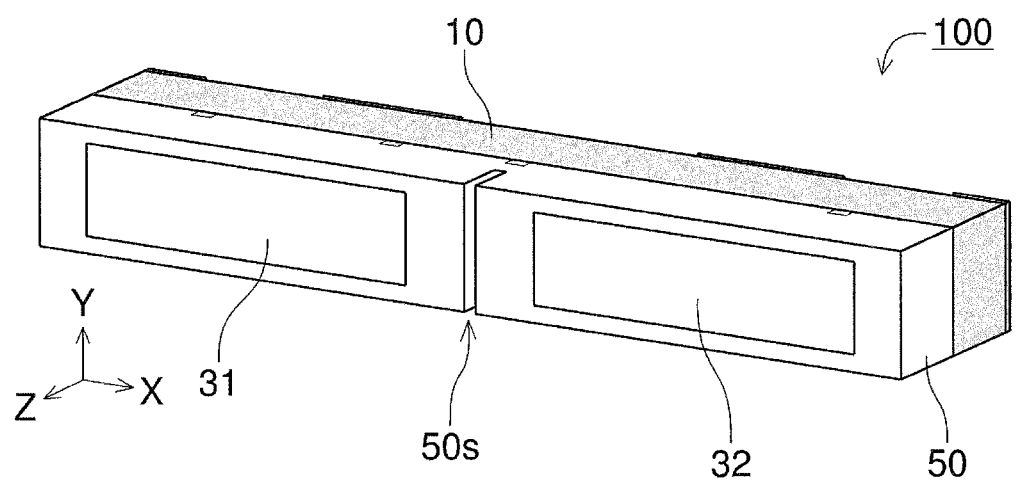
FIG. 1A is a schematic perspective view of a light emitting device according to one embodiment of the present invention.

The embodiments will now be described with reference to the accompanying drawings, wherein like reference numerals designate corresponding or identical elements throughout the various drawings. It is to be noted that the light emitting device described below is intended for implementing the technical concept of the present invention, and the present invention is not limited to those described below unless otherwise specified. The sizes and the positional relationships of the members in each of the drawings are occasionally shown exaggerated for ease of explanation.

In the description below, "visible wavelength region" corresponds to a wavelength range of 380 nm to 780 nm, in which "blue region" corresponds to a wavelength range of 420 nm to 480 nm, "green region" corresponds to a wavelength range of 500 nm to 560 nm, "yellow region" corresponds to a wavelength range of 560 to 590 nm, and "red region" corresponds to a wavelength range of 610 nm to 750 nm.

First Embodiment

Figure 1B:
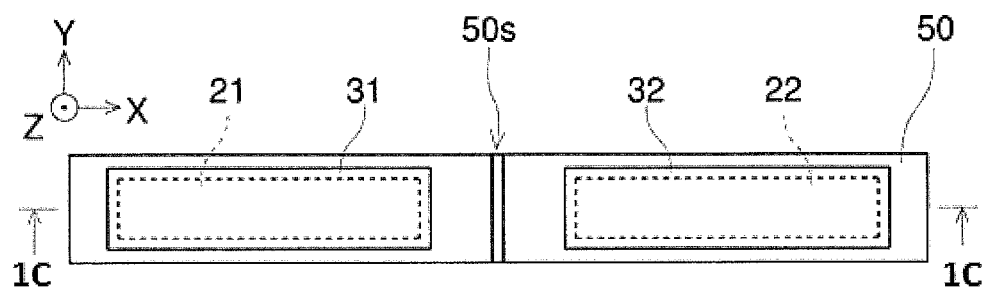
FIG. 1B is a schematic front view of the light emitting device shown in FIG. 1A.
Figure 1C:
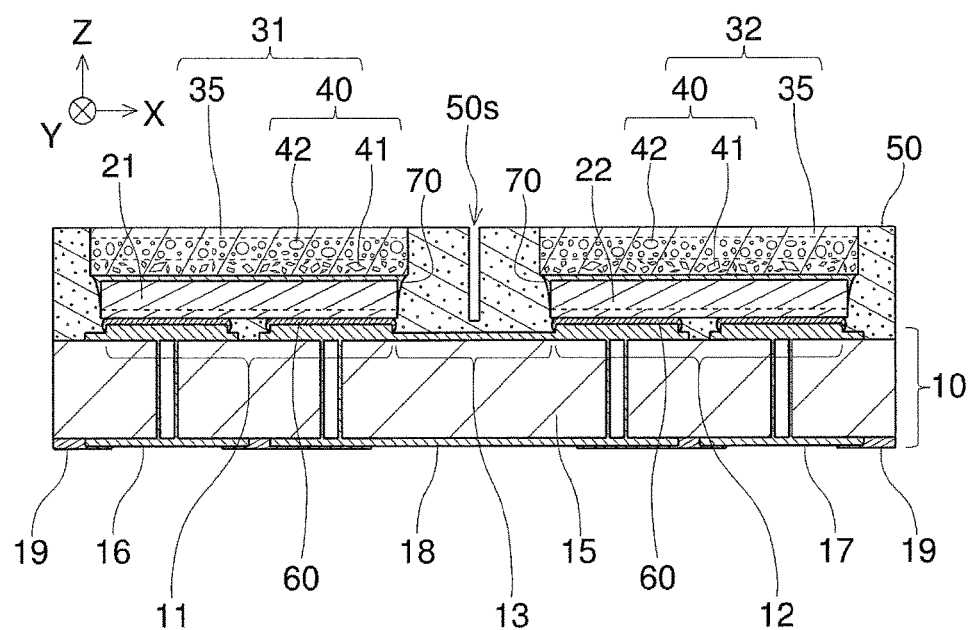
FIG. 1C is a schematic cross sectional view taken along line 1C-1C of FIG. 1B.
Figure 1D:
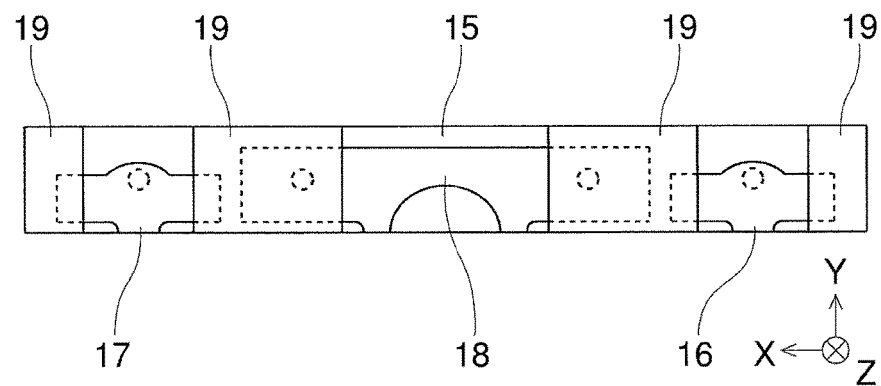
FIG. 1D is a schematic back view of the light emitting device shown in FIG. 1A.
Figure 1E:
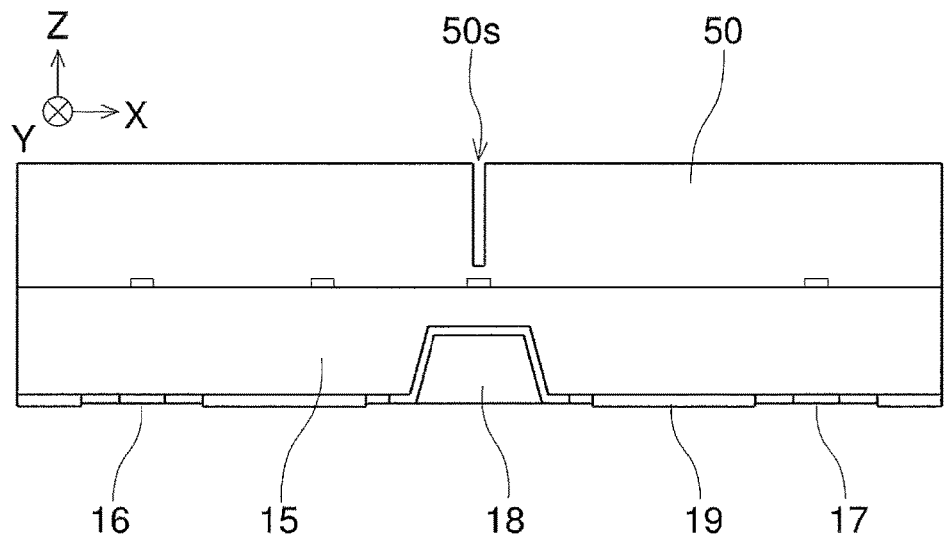
FIG. 1E is a schematic side view of the light emitting device shown in FIG. 1A.
Figure 1F:
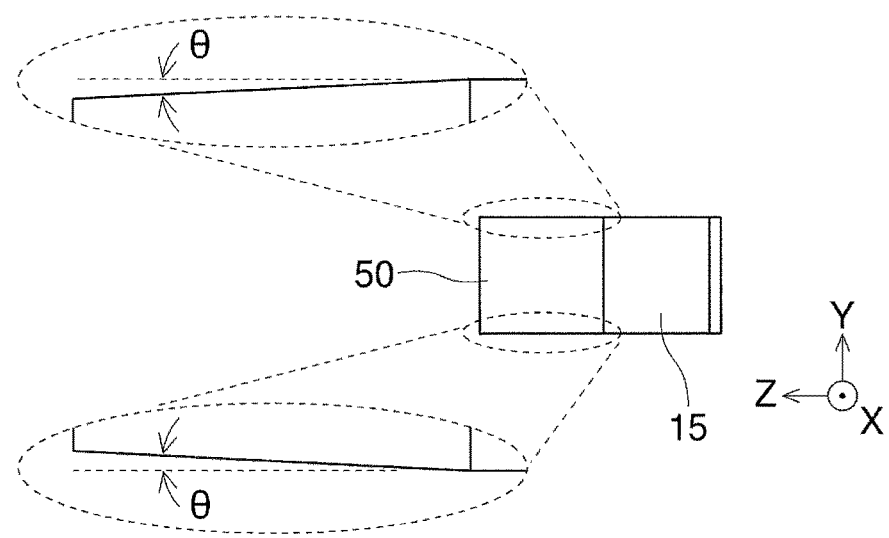
FIG. 1F is a schematic side view of the light emitting device shown in FIG. 1A.
Figure 2:
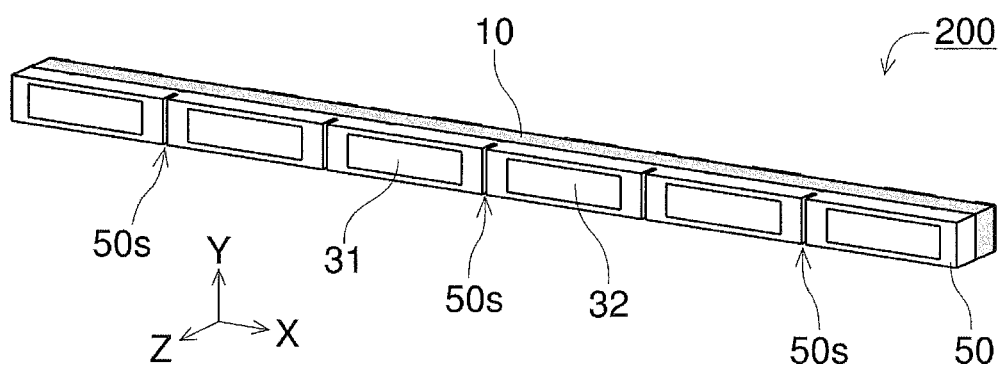
FIG. 2 is a schematic perspective view of another light emitting device according to one embodiment of the present invention.

FIG. 1A is a schematic perspective view of a light emitting device 100 according to a first embodiment of the present invention. FIG. 1B is a schematic front view of the light emitting device 100 shown in FIG. 1A. FIG. 1C is a schematic cross sectional view taken along line 1C-1C of FIG. 1B. FIG. 1D is a schematic back view of the light emitting device 100 shown in FIG. 1A. FIG. 1E is a schematic side view of the light emitting device 100 shown in FIG. 1A. FIG. 1F is a schematic side view of the light emitting device 100 shown in FIG. 1A. FIG. 2 is a schematic perspective view of another light emitting device 200 according to the first embodiment.

In FIGS. 1A to 1F, a lateral (width) direction, a longitudinal (thickness) direction, and a front-back (depth) direction of the light emitting device 100 are indicated as an X-direction, a Y-direction, and a Z-direction, respectively. The X-, Y-, and Z-directions (or axes) are perpendicular to each other. In more detail, in FIG. 1B, a rightward direction is indicated as $^+$X-direction, a leftward direction is indicated as $^-$X-direction, an upward direction is indicated as $^+$Y-direction, a downward direction is indicated as $^-$Y-direction, a frontward direction is indicated as $^+$Z-direction, and a backward direction is indicated as $^-$Z-direction. A lateral surface of the light emitting device which faces the $^-$Y-direction serves as a mounting surface of the light emitting device 100. The $^+$Z-direction is a main light-emitting direction of the light emitting device 100. In the description below, a surface facing the $^+$Z-direction will be referred to as a front surface and a surface facing the $^-$Z-direction will be referred to as a back surface, with respect to each component of the light emitting device 100.

As shown in FIGS. 1A to 1F, the light emitting device 100 according to the first embodiment includes a base member 10, a first light emitting element 21, a second light emitting element 22, and a covering member 50. A front surface of the substrate member (a substrate) 10 includes a first land 11, a second land 12, and an intermediate wiring 13. The intermediate wiring 13 is arranged between the first land 11 and the second land 12. The first light emitting element 21 is mounted on the first land 11 in a flip-chip configuration. That is, positive and negative electrodes provided on a back surface of the first light emitting element 21 are electrically connected to the first land 11 via an electrically conductive adhesive member 60. The second light emitting element 22 is mounted on the second land 12 in a flip-chip configuration. That is, positive and negative electrodes provided on a back surface of the second light emitting element 22 are electrically connected to the second land 12 via an electrically conductive adhesive member 60. A covering member 50 is disposed on the intermediate wiring 13. The covering member 50 also covers lateral surfaces of the first light emitting element 21 and lateral surfaces of the second light emitting element 22. The covering member 50 has light reflective properties. The covering member 50 over the intermediate wiring 13 defines a first recess 50s with a bottom surface and lateral surfaces. The bottom surface of the first recess 50s is spaced from the intermediate wiring 13, and a distance of the bottom surface of the first recess 50s to the front surface of the covering member 50 is greater than a distance of the front surface of the first light emitting element 21 to the front surface of the covering member 50 and a distance of the front surface of the second light emitting element 22 to the front surface of the covering member 50. The lateral surfaces defining the first recess 50s are portions of external surfaces of the light emitting device 100. That is, the first recess 50s is hollow.

The light emitting device 100 having a configuration as described above is provided with the first recess 50s with the depth as described above that serve as an expansion margin for the covering member 50 between the first light emitting element 21 and the second light emitting element 22. Thus, accumulation of thermal stress in the covering member 50 can be reduced, which in turn can reduce occurrence of cracks in a main portion of the covering member 50. Moreover, with the depth of the first recess 50s as described above, exposure of the intermediate wiring 13 to the environment can be prevented, so that corrosion of the intermediate wiring 13 can be reduced. Also, the first recess 50s can serve as a guide for positioning the light emitting device 100.

In the present specification, the "main portion" of the covering member 50 refers to portions directly covering the lateral surfaces of the first light emitting element 21, the second light emitting element 22, and the first light-transmissive member 31 and the second light-transmissive member 32 to be described later below. For example, the portion of the covering member 50 between the bottom of the first recess 50s and the front surface of the intermediate wiring 13 is excluded from the "main portion". The front surface of the covering member 50 may be a flat surface, or may be a concave surface formed by rising of the covering member 50 due to surface tension and/or by curing-shrinkage of the covering member 50, for example. Note that the first recess 50s is formed independently of the concave surface. The first recess 50s can be formed by cutting with the use of a rotary disk-type dicing saw, cutting with the use of a pull-cut blade or a push-cut blade, or by molding with the use of a mold.

When the Z-direction represents up-down direction or height direction of the light emitting device, the bottom of the first recess 50s is located lower (or higher) than the upper surface of the first light emitting element 21 and the upper surface of the second light emitting element 22 and higher (or lower) than the upper surface of the intermediate wiring 13. In this case, the reference surface for up-down or height is the upper surface of the base member 15 of the substrate member.

Next, preferable configurations of the light emitting device 100 will be described below.

As shown in FIGS. 1A to 1C and FIG. 1E, the first recess 50s of the first embodiment reaches two lateral surfaces of the covering member 50 that are perpendicular to the Y-direction. In a front view, the first recess 50s preferably reaches at least one of the two lateral surfaces of the covering member 50 that are perpendicular to a plane of array of the first land 11 and the second land 12. With the first recess 50s formed as described above, accumulation of thermal stress in the covering member 50 over the intermediate wiring 13 can be easily reduced, which in turn can reduce the occurrence of cracks in the main portion of the covering member 50. In a front view, the first recess 50s may be formed to reach at least one, preferably both of the two lateral surfaces of the covering member 50 that are perpendicular to a plane of array of the first land 11 and the second land 12.

In order to further facilitate reduction of accumulation of thermal stress in the covering member 50 over the intermediate wiring 13, it is preferable that the bottom of the first recess 50s is located backward with respect to the front surface of the first light emitting element 21 and the front surface of the second light emitting element 22. It is more preferable that, as shown in FIGS. 1A to 1C, and 1E, the bottom of the first recess 50s is located backward with respect to the back surface of the first light emitting element 21 and the back surface of the second light emitting element 22. When the first light emitting element 21 and the second light emitting element 22 respectively have a substrate (hereinafter referred to as "element substrate" to distinguish from the substrate member 10), the front surface of the semiconductor layer can be regarded flush with the back surface of the element substrate.

In a front view, the first recess 50s is preferably formed at a central portion between the first light emitting element 21 and the second light emitting element 22, or at a central portion between a first light-transmissive member 31 and a second light-transmissive member 32 to be described later below. Alternatively, it is preferable that the first recess 50s is formed in line symmetry with respect to a centerline between the two light emitting elements 21, 22 or between the two light-transmissive members 31, 32. The first recess 50s may be formed in a line shape as shown in the figures, or in spots or the like, in a front view. When the first recess 50s is formed in a line shape in a front view, in addition to a straight line shape as shown in the figures, a curved line shape, a wavy line shape, a broken line shape, a zigzag line shape, or the like, can be employed. When the first recess 50s is formed in a straight line shape in a front view, it is preferably formed in parallel to the Y-direction (or axis), but it may be formed at an angle with respect to the Y-direction (or axis). A cross-sectional shape of the first recess 50s may be a rectangular shape as shown in the figures or may be another shape such as a triangular shape, an inverted trapezoidal shape, or the like, or such a shape with rounded bottom. Medial axis of the cross-section of the first recess 50s is preferably in parallel to the Z-direction (or axis) as shown in the figures, but it may be formed at an angle with respect to the Z-direction (or axis). A single first recess 50s s is shown in the figures, but a plurality of first recess 50s may be formed as appropriate.

The lower-limit value of the width of the first recess 50s in the X-direction may be appropriately determined, but in view of appropriate expansion allowance of the covering member 50, 0.01 mm or greater is preferable, 0.1 mm or greater is more preferable. The resin molded body 20 may have an appropriate thickness (an upper-limit value) in the X-direction, but the thickness of 1.2 mm or less is preferable, 1.0 mm or less is more preferable, and 0.8 mm or less is further preferable.

As shown in FIGS. 1A to 1E, the substrate member 10, the first light emitting element 21, the second light emitting element 22, and the covering member 50 of the first embodiment are formed elongated in the X-direction. As described above, the covering member 50 has a shape elongated in the array direction of the first land 11 and the second land 12. The amount of the thermal expansion of the covering member 50 tends to be greater in its longitudinal direction. Therefore, when the covering member 50 has a shape elongated in the array direction of the first land 11 and the second land 12, the thermal stress on the covering member 50 over the intermediate wiring 13 tends to increase. In such a configuration with the first recess 50s, reduction in accumulation of thermal stress in the covering member 50, can be more efficiently obtained.

The smaller the linear expansion coefficient of the base member 15 of the substrate member 10, the less disengaging the first light emitting element 21 and the second light emitting element 22 that have been fixed on the substrate member 10, which likely increase the thermal stress on the covering member 50 located between the two light emitting elements. In such a configuration, reduction in accumulation of thermal stress in the covering member 50 that is obtained by providing the first recess 50s can be more efficiently facilitated. The base member 15 of the substrate member 10 with an appropriate linear expansion coefficient can be used, but the linear expansion coefficient of 15 ppm/° C. or less is preferable, 10 ppm/° C. or less is more preferable, and 5 ppm/° C. or less is further preferable. The lower-limit value of the linear expansion coefficient of the base member 15 of the substrate member 10 is, for example, 1 ppm/° C. or greater.

As shown in FIG. 1F, the lateral surface of the covering member 50 facing the ⁻Y-direction are preferably inwardly inclined in the ⁻Y-direction of the light emitting device 100 with respect to the lateral surface of the substrate member 10 facing the ⁻Y-direction. With this arrangement, at the time of mounting the light emitting device 100 on the wiring substrate or the like, physical contact between the lateral surfaces of the covering member 50 and the surface of the wiring substrate can be reduced, facilitating stable mounting of the light emitting device 100. Further, in case of thermal expansion of the covering member 50, degree of stress generated by physical contact of the covering member 50 and the wiring substrate can be reduced. The lateral surface of the covering member 50 respectively facing the ⁺Y-direction are also preferably inwardly inclined in the ⁺Y-direction of the light emitting device 100 with respect to the lateral surface of the substrate 10 facing the ⁺Y-direction. With this configuration, physical contact between the lateral surfaces of the covering member 50 and a suction nozzle (collet) used in mounting process can be reduced, which can facilitate reduction of damage of the covering member 50 when sucking the light emitting device 100. Also, when the light emitting device 100 is incorporated in a lighting unit or the like, the lateral surfaces of the substrate member 10 will be in physical contact with peripheral members before the lateral surfaces of the covering member 50, so that stress distortion of the covering member 50 can be reduced. The above will also contribute to reduce cracking in the main portion of the covering member 50. In other words, in the front view, the lateral surfaces of the covering member 50 facing a direction perpendicular to the array direction of the first land 11 and the second land 12 are preferably inwardly inclined with respect to the lateral surfaces of the substrate member 10 facing the same direction. The inclination angle θ of the two lateral surfaces of the covering member 50 can be appropriately determined, but in view of efficiency and appropriate thickness of the covering member 50, the inclination angle θ is preferably in a range of 0.3° to 3°, more preferably in a range of 0.5° to 2°, further preferably in a range of 0.7° to 1.5°.

As shown in FIGS. 1D and 1E, the back surface of the base member 15 of the substrate member 10 preferably formed with a second recess at a location corresponding to the first recess 50s. A combination of the second recess and the first recess 50s allows a preferable configuration that can disperse stress in the covering member 50, which can further facilitate reduction of cracking in the main portion of the covering member 50.

As shown in FIG. 1C, the light emitting device 100 includes a first light emitting element 31 bonded on the front surface of the first light emitting element 21 and contains a wavelength converting material 40 that can absorb light of the first light emitting element 21 and emit light, and a second light-transmissive member 32 bonded to the front surface of the second light emitting element 22 and contains a wavelength converting material 40 that can absorb light of the second light emitting element 22 and emit light. The covering member 50 preferably covers lateral surfaces of the first light-transmissive member 31 and lateral surfaces of the second light-transmissive member 32. As described above, in a configuration where the first light-transmissive member 31 and the second light-transmissive member 32 respectively containing the wavelength converting material 40 that generates heat are bonded on the front surface of the first light emitting element 21 and the front surface of the second light emitting element 22 respectively, thermal stress accumulated in the covering member 50 over the intermediate wiring 13 tends to increase. In such a configuration, reduction in accumulation of thermal stress in the covering member 50, obtained by providing the first recess 50s, can be more efficiently exhibited. In the first embodiment, the first light-transmissive member 31 and the second light-transmissive member 32 are bonded to the first light emitting element 21 and the second light emitting element 22 via the light guide member 70, respectively. Alternatively, the front surface of the first light emitting element 21 and the back surface of the first light-transmissive member 31, and the front surface of the second light emitting element 22 and the back surface of the second light-transmissive member 32 may be directly bonded.

The wavelength converting material 40 preferably contains a manganese activated fluoride fluorescent material. Manganese activated fluoride-based fluorescent materials can produce an emission with relatively narrow spectral line width and preferable in view of color reproductivity, but are easily degraded by moisture. Thus, facilitating reduction in accumulation of thermal stress in the covering member 50 by the first recess 50s, reduction in the occurrence of fracture in the main portion of the covering member 50, and further facilitating reduction of moisture entering through the fractures.

The intermediate wiring 13 may be used to supply electricity to the first light emitting element 21 and the second light emitting element 22. In such case, corrosion of the intermediate wiring 13 may easily affect performance of the first light emitting element 21 and the second light emitting element 22. Thus, with the first recess 50s formed with a depth as described above, exposure of the intermediate wiring 13 to the environment can be avoided, so that reduction of corrosion of the intermediate wiring 13 can be obtained.

The embodiments according to the present invention will be described below with reference to the drawings.

Light Emitting Device 100

The light emitting device 100 is, for example, a light emitting diode (LED) device. In the first embodiment, the light emitting device 100 of side-emission type (also referred to as "side-view type") is described, but the light emitting device can also be of top-emission type (also referred to as "top-view type"). In a light emitting device of side-emission type, mounting direction and main emission direction are approximately perpendicular to each other. In a light emitting device of top-emission type, mounting direction and main emission direction are in approximately parallel to each other. The shape of the light emitting device in a front view, i.e., the shape seen from the main emission direction may be appropriately designed, but an approximately rectangular shape is preferable in view of mass productivity. In particular, when the light emitting device is a side-emission type, the shape in a front view is preferably an approximately rectangular shape having longitudinal sides] and lateral sides that are approximately perpendicular to each other. Meanwhile, when the light emitting device is a top-emission type device, approximately square shape in a front view is preferably employed. The first light emitting element and the second light emitting element preferably respectively have a shape in a front view similar to that of the light emitting device.

Substrate Member 10

The substrate member 10 includes a base member 15 and a wiring held by the base member 15.

First Land 11, Second Land 12, Intermediate Wiring 13, First Terminal Wiring 16, Second Terminal Wiring 17, Third Terminal Wiring 18

Wiring is arranged at least on the front surface of the base member 15, and may also be arranged in the base member 15 and/or on one or more lateral surfaces and/or a back surface of the base member 15. Moreover, the wiring preferably includes lands to mount the first light emitting element and the second light emitting element respectively, terminal wirings to be connected to an external circuit, and an intermediate wiring connecting between the lands, and lead wirings connecting the lands and their corresponding terminal wirings, respectively. The wiring can be made of copper, iron, nickel, tungsten, chromium, aluminum, silver, gold, titanium, palladium, rhodium, or an alloy of two or more of those metals. The wiring can either be a single layer or a multilayer made of one or more of those metals or alloys. Particularly, copper or a copper alloy is preferable in view of heat dissipation performance. In view of wettability of a bonding member and/or light reflective properties, surfaces of the wiring may be provided with a layer made of silver, platinum, aluminum, rhodium, gold or an alloy thereof.

Base Member 15

The base member 15 can be formed by using resin or fiber reinforced resin, ceramics, glass, a metal, paper, or the like, for example. Examples of the resin or fiber reinforced resin include epoxy resins, glass epoxy resins, bismaleimide triazine (BT) resins, and polyimide resins. Examples of the ceramics include aluminum oxide, aluminum nitride, zirconium oxide, zirconium nitride, titanium oxide, titanium nitride, and a mixture of two or more of those. Examples of the metal include copper, iron, nickel, chromium, aluminum, silver, gold and titanium or those including alloys thereof. Of the materials for the base member 15 described above, a material or materials having a linear expansion coefficient similar to the linear expansion coefficient of the first light emitting element and the second light emitting element is preferably used. The lower-limit value of the thickness of the base member can be appropriately determined, but in view of mechanical strength of the substrate member, 0.05 mm or greater is preferable, and 0.2 mm or greater is more preferable. The upper-limit value of the thickness of the base member is, in view of the thickness (e.g., front-back dimension) of the light emitting device, 0.5 mm or less is preferable and 0.4 mm or less is more preferable.

Insulating Film 19

For the insulating film, various solder resists, cover lay films, or the like, may be used.

First Light Emitting Element 21, Second Light Emitting Element 22

The first light emitting element and the second light emitting element respectively have at least a semiconductor element structure and in many cases further have an element substrate. For the first light emitting element and the second light emitting element, LED chips may be used, for example. In a front view, the light emitting element preferably has an approximately rectangular shape, particularly an approximately square shape or an approximately rectangular shape elongated in one direction, but other appropriate shape can also be employed. For example, when employing an approximately hexagonal shape, the luminous efficiency can be improved. The lateral surfaces of the first light emitting element and the second light emitting element, or the lateral surfaces of their corresponding element substrates may be perpendicular to respective front surfaces, or may be inwardly or outwardly inclined. The first light emitting element and the second light emitting element preferably have positive and negative (p- and n-) electrodes on a same surface side, respectively. Three or more of light emitting elements may be provided in a single light emitting device. A single light-transmissive member may be provided corresponding to each of the light emitting elements. When three or more light emitting elements and three or more corresponding light-transmissive members are employed, as shown in FIG. 2, the recesses of the covering member are preferably provided between every adjacent two light emitting elements or between every adjacent two light-transmissive members, respectively. The plurality of light emitting elements can be electrically connected either in series or in parallel. The semiconductor element structure includes a semiconductor layered structure, that is, at least an n-type semiconductor layer and a p-type semiconductor layer, and preferably includes an active layer therebetween. The semiconductor element structure may include positive and negative electrodes and/or an insulating film. The positive and negative electrodes can be made of gold, silver, tin, platinum, rhodium, titanium, aluminum, tungsten, palladium, nickel, or an alloy thereof. The insulating film can be made of oxide or nitride of at least one element selected from the group consisting of silicon, titanium, zirconium, niobium, tantalum, and aluminum. The emission peak wavelength of the first light emitting element and the second light emitting element can be respectively selected from ultraviolet to infrared range by the semiconductor materials and the mixed crystal ratio thereof. For the semiconductor materials, nitride-based semiconductor that can emit light of short-wavelength that can efficiently excite wavelength converting material is preferably employed. The nitride-based semiconductor can be represented by $In_xAl_yGa_{1-x-y}N$ ($0 \leq x$, $0 \leq y$, $x+y \leq 1$). The first light emitting element and the second light emitting element preferably have an emission peak wavelength in a range of 400 nm to 530 nm, more preferably in a range of 420 nm to 490 nm, further preferably in a range of 450 nm to 475 nm, in view of luminous efficiency and excitation efficiency of wavelength converting material and mixed light colors of the emissions of the light emitting elements and the wavelength converting material. Other materials such as InAlGaAs-based semiconductors, InAlGaP-based semiconductors, zinc sulfide, zinc selenide, silicon carbide, or the like can also be used. The element substrate for the first light emitting element and the second light emitting element may generally be a growth substrate that allows growth of semiconductor crystals that constitute the semiconductor element structure, but may also be a bonding substrate that is bonded to the semiconductor element structure that is separated from the growth substrate. With the use of a light-transmissive element substrate, flip-chip mounting can be facilitated and also, the light extraction efficiency can be improved. Examples of the base material for the element substrate include sapphire, spinel, gallium nitride, aluminum nitride, silicon, silicon carbide, gallium arsenide, gallium phosphide, indium phosphide, zinc sulfide, zinc oxide, zinc selenide, and diamond. Of those, sapphire is preferable. The element substrate can have an appropriate thickness, for example, in a range of 0.02 mm to 1 mm, and in view of the strength of the element substrate and/or the thickness of the light emitting device, preferably in a range of 0.05 mm to 0.3 mm.

First Light-transmissive Member 31, Second Light-transmissive Member 32

The first light-transmissive member and the second light-transmissive member are disposed on the first light emitting element and the second light emitting element respectively, each allowing light emitted from the first light emitting element or the second light emitting element passes therethrough to the outside of the light emitting device. The first light-transmissive member and the second light-transmissive member may include a base material as described below. A wavelength converting material can be optionally contained in each of the base materials of the first light-transmissive member and the second light-transmissive member so that the first light-transmissive member and the second light-transmissive member can serve as a wavelength converting member. For the first light-transmissive member and the second light-transmissive member, a sintered body of a wavelength converting material and an inorganic material such as alumina, a plate-like crystal of a wavelength converting material, or the like can be used.

Base Material 35 for Light-Transmissive Member

The base materials for the first light-transmissive member and the second light-transmissive member are transmissive to light emitted from the first light emitting element and the second light emitting element respectively. In the present specification, the term "light-transmissive" refers to an optical transmittance at a peak emission wavelength of the first light emitting element or the second light emitting element of preferably 60% or greater, more preferably 70% or greater, further preferably 80% or greater. For the base materials for the first light-transmissive member and the second light-transmissive member, silicone resin, epoxy resin, phenol resin, polycarbonate resin, acrylic resin, modified resin thereof, or glass may be used. Among those, silicone resin and modified silicone resin are preferable because they have good heat-resisting properties and light-resisting properties. More specific examples of silicone resin include dimethyl silicone resin, phenylmethyl silicone resin, and diphenyl silicone resin. The first light-transmissive member and the second light-transmissive member can be formed of a single layer of one of those base materials or formed of a multilayer of two or more of those base materials. In the present specification, the term "modified resin" also refers to hybrid resins.

Examples of the base materials for the first light-transmissive member and the second light-transmissive member also include one or more resin or glass of the above containing one or more kinds of filler materials. Specific examples of the filler materials include silicon oxide, aluminum oxide, zirconium oxide, and zinc oxide. For the filler material, one of the above may be used alone or two or more of the above may be used in combination. In particular, silicon oxide that has a small thermal expanding coefficient is preferable. Alternatively, with the use of nano-particles as filler material, scattering of light emitted from the first light emitting element and the second light emitting element, including Rayleigh scattering of blue light, can be increased, which can allow a decrease in the usage amount of the wavelength converting material. In the present specification, the term "nano-particles" refers to particles with particle size in a range of 1 nm to 100 nm. In the present specification, the particle size may be represented by a median particle size $D_{50}$.

Wavelength Converting Material 40

The wavelength converting material can absorb at least a part of primary light emitted from the first light emitting element and/or the second light emitting element and emits secondary light having different wavelength than that of the primary light. Accordingly, the light emitting device that can emit mixed-color light of the primary light of visible wavelength and the secondary light of visible wavelength, for example white light, can be obtained. For the wavelength converting material, these substances shown below as specific examples may be used singly or a combination of two or more of these materials may be used.

First Fluorescent Material 41, Second Fluorescent Material 42

The first fluorescent material and the second fluorescent material can be selected from the examples shown below. For example, the first fluorescent material may be a fluorescent material that can emit green to yellow light, and the second fluorescent material may be a first fluorescent material that can emit red light. Specific examples of the fluorescent materials that can emit green light include yttrium-aluminum-garnet-based fluorescent materials (for example, $Y_3(Al,Ga)_5O_{12}$:Ce), lutetium-aluminum-garnet-based fluorescent materials (for example $Lu_3(Al,Ga)_5O_{12}$:Ce), terbium-aluminum-garnet-based fluorescent materials (for example $Tb_3(Al,Ga)_5O_{12}$:Ce), silicate-based fluorescent materials (for example $(Ba,Sr)_2SiO_4$:Eu), chlorosilicate-based fluorescent materials (for example $Ca_8Mg(SiO_4)_4Cl_2$:Eu), β-sialon-based fluorescent materials (for example $Si_{6-z}Al_zO_zN_{8-z}$:Eu (0<Z<4.2)), and SGS-based fluorescent materials (for example $SrGa_2S_4$:Eu). Specific examples of the fluorescent materials that can emit yellow light include α-sialon-based fluorescent materials (for example $Mz(Si,Al)_{12}(O,N)_{16}$ (where $0<Z\leq2$, M is at least one element selected from a group consisting of Li, Mg, Ca, Y, and lanthanoid elements except for La and Ce). Of the fluorescent materials that can emit green light shown above, some fluorescent materials can emit yellow light. For example, yttrium-aluminum-garnet-based fluorescent materials can emit yellow light by substituting a portion of Y with Gd to shift the emission peak wavelength to a longer wavelength side. Among the fluorescent materials shown above, some fluorescent materials can emit red light. Specific examples of the fluorescent material that can emit red light include nitrogen-containing calcium aluminosilicate (CASN or SCASN)-based fluorescent materials (for example $(Sr,Ca)AlSiN_3$:Eu), and manganese-activated potassium fluosilicate-based fluorescent materials (represented by a formula (I): $A_2[M_{1-a}Mn_aF_6]$, where A is at least one selected from the group consisting of K, Li, Na, Rb, Cs and $NH^{4+}$; M is at least one element selected from the group consisting of Group 4 elements and Group 14 elements; and a satisfies the formula of 0<a<0.2). Typical examples of the manganese-activated potassium fluosilicate-based fluorescent materials include manganese-activated potassium fluosilicate-based fluorescent materials (for example $K_2SiF_6$:Mn).

Covering Member 50

In view of light extraction efficiency in the frontward direction, the light reflective covering member has an optical reflectance of 70% or greater, more preferably 80% or greater, further preferably 90% or greater at the emission peak wavelength of the first light emitting element and the second light emitting element. Moreover, the covering member preferably has a white color. Thus, the covering member is preferably made of a base material containing white pigment. The material of the covering member passes through a flowable state, that is, a fluid state before being hardened or cured. The covering member can be molded by transfer molding, injection molding, compression molding, potting, or the like.

Base Material for Covering Member 50

Specific examples of the base material for the sealing member 70 include silicone resin, epoxy resin, phenol resin, polycarbonate resin, acrylic resin, or modified resin thereof or hybrid resin thereof. Among those, silicone resin and modified silicone resin are preferable because they have good heat-resisting properties and light-resisting properties. More specific examples of silicone resin include dimethyl silicone resin, phenylmethyl silicone resin, and diphenyl silicone resin. Examples of the base materials for the covering member may include one or more filler materials similar to those contained in the base materials of the first light-transmissive member and the second light-transmissive member as described above.

White Pigment

Examples of the while pigment include titanium oxide, zinc oxide, magnesium oxide, carbonate magnesium, magnesium hydroxide, calcium carbonate, calcium hydroxide, calcium silicate, magnesium silicate, barium titanate, barium sulfate, aluminum hydroxide, aluminum oxide, and zirconium oxide. The white pigment can have an appropriate shape which may be irregular shape (crushed shape), but in view of fluidity, an approximately spherical shape is preferable. The white pigment may have a particle size in a range of, for example, 0.1 μm to 0.5 μm, but in order to improve light reflective properties and/or covering effect, smaller particle size is preferable. The content of the white pigment in the light reflective covering member can be appropriately selected, but in view of light reflective properties and viscosity in its liquid phase, for example, a content in a range of 10 wt % to 80 wt % is preferable, 20 wt % to 70 wt % is more preferable, and 30 wt % to 60 wt % is further preferable. In the above, "wt %" stands for "weight percent", indicating a weight ratio of corresponding material with respect to a total weight of all the component materials of the light reflective covering member.

Electrically Conductive Bonding Member 60

Examples of the electrically conductive member include bumps made of gold, silver, or copper, a metal paste including a metal powder of silver, gold, copper, platinum, aluminum, or palladium and a resin binder, solders such as tin-bismuth-based solders, tin-copper-based solders, tin-silver-based solders, gold-tin-based solders, brazing materials such as low-melting-point metals.

Light Guide Member 70

A light guide member is configured to bond the light emitting element and the light-transmissive member and to guide light from the light emitting element to the light-transmissive member. Specific examples of the base material for the sealing member 70 include silicone resin, epoxy resin, phenol resin, polycarbonate resin, acrylic resin, or modified resin thereof or hybrid resin thereof. Among those, silicone resin, modified resin thereof, and hybrid resin thereof are preferable because they have good heat-resisting properties and light-resisting properties. More specific examples of silicone resin include dimethyl silicone resin, phenylmethyl silicone resin, and diphenyl silicone resin. The base material of the light guide member may contain a filler that is similar to the base material of the first light-transmissive member and the second light-transmissive member may be. The light guide member can be optional.

EXAMPLES

Hereinafter, examples according to the embodiments of the present invention will be described in detail. Needless to say, the present invention is not limited only to the examples described below.

Example 1

A light emitting device of Example 1 is a side-surface light emission type LED having the structure of the light emitting device 100 in the example illustrated in FIGS. 1A to 1D.

The substrate member 10 has a size of a width of 3.1 mm, a length of 0.4 mm, and a depth (thickness) of 0.36 mm. The base member 15 of the substrate member is a small rectangular parallelepiped piece made of a BT resin having a linear expansion coefficient of 3 ppm/° C., for example, HL832NSF•type LCA, manufactured by Mitsubishi Gas Chemical Company, Inc. The wiring is made of, from the base member 15 side, copper/nickel/gold layered in this order. The wiring on the front surface of the base member 15 includes the first land 11 at $^-$X side and the second land 12 at $^+$X side, with the intermediate wiring 13 at a center in the X-direction. The first land 11 and the second land 12 respectively include positive and negative terminals. Each of the terminals is made of a copper layer having a protrusion of 0.04 mm thickness. The intermediate wiring 13 electrically connects the positive terminal of the first land 11 and the negative terminal of the second land 12. The base member 15 defines four through-vias, and the wirings disposed on the front surface are electrically connected to corresponding wirings disposed on the back surface through the through vias, respectively. On the back side of the base member 15, a first terminal wiring 16 electrically connected to the negative terminal of the first land, a second terminal wiring 17 electrically connected to the positive terminal of the second land, and a third terminal wiring 18 electrically connected to the positive terminal of the first land and the negative terminal of the second land are disposed. The back surface of the base member 15 defines a second recess at a center portion in the X-direction. The second recess is adjacent to the lateral surface faces the $^-$Y direction, the third terminal wiring 18 is disposed extending on the surface defining the second recess. The second recess is defined by a semi-cylindrical wall with a lateral side of 0.4 mm, a longitudinal side of 0.2 mm, and a depth of 0.2 mm. A portion of each wiring on the back surface is covered with an insulating film 19 that is a solder resist.

The first light emitting element 21 and the second light emitting element 22 are flip-chip mounted on the first land 11 and the second land 12 via an electrically conductive adhesive member 60, respectively. The first light emitting element 21 and the second light emitting element 22 are respectively an approximately rectangular parallelepiped-shaped LED chip which has an n-type layer, an active layer, and a p-type layer of nitride semiconductors layered on a sapphire substrate, and can emit blue light (emission peak wavelength of about 452 nm), and has a lateral length of 1.1 mm, a longitudinal length of 0.2 mm, and a thickness of 0.12 mm. The electrically conductive adhesive member 60 is a gold-tin-based solder (Au:Sn=79:21), with a thickness of 0.015 mm.

Over the first light emitting element 21 and the second light emitting element 22, the first light-transmissive member 31 and the second light-transmissive member 32 are bonded via the light guide member 70, respectively. The first light-transmissive member 31 and the second light-transmissive member 32 are respectively a rectangular parallelepiped with a lateral length of 1.21 mm, a longitudinal length of 0.24 mm, and a thickness of 0.16 mm, made of a base material 35 of phenylmethyl silicone resin containing a filler of nano-particles of silicon oxide, and wavelength converting material 40 of a first fluorescent material 41 of europium-activated β-sialon-based fluorescent material and a second fluorescent material 42 of manganese-activated potassium fluosilicate-based fluorescent material that is contained in the base material 35. The first light-transmissive member 31 and the second light-transmissive member 32 are respectively include a layer made of the base material 35 and the first fluorescent material 41, a layer made of the base material 35 and the second fluorescent material 42, and a layer made of the base material 35 layered in this order from the respective light emitting element 21, 22 side. The light guide member 70 is a cured dimethyl silicone resin with a thickness of 0.005 mm.

The light reflective covering member 50 is disposed on the front surface of the substrate member 10 so as to cover the intermediate wiring 13, entire lateral surfaces of the first light emitting element 21, the second light emitting element 22, the first light-transmissive member 31, and the second light-transmissive member 32. The covering member 50 is made of a base material of phenylmethyl silicone resin and a white pigment of titanium oxide contained in the base material in an amount of 60 wt %. The covering member 50 directly covers the lateral surfaces of the first light emitting element 21, the second light emitting element 22, the first light-transmissive member 31, the second light-transmissive member 32, the electrically conductive adhesive member 60, and the light guide member 70. The front surface of the covering member 50 is substantially flash with the front surface of the first light-transmissive member 31 and the front surface of the second light-transmissive member 32. The outer peripheral edge at a backmost part of the covering member 50 corresponds to the outer peripheral edge of the front surface of the substrate member 10, but each of the lateral surfaces of the covering member 50 is inclined inward at an angle of 0.8° with respect to a plane of respective adjacent lateral surface of the substrate member 10. The covering member 50 over the intermediate wiring 13, in more detail the front surface of the covering member 50 defines a first recess 50s with a lateral length of 0.05 mm and a depth of 0.24 mm, reaching two lateral surfaces respectively facing the $^-$Y direction and the $^+$Y direction, at an approximately the center (approximately center portion between the first light-transmissive member 31 and the second light-transmissive member 32) in the X direction.

The light emitting device according to Example 1 has an effect similar to that in the first embodiment.

The light emitting device according to an embodiment of the present invention is applicable for a backlight light source of a liquid crystal display, various illumination devices, various display apparatuses such as a large-screen display, an advertisement, a destination guide and the like, and furthermore, an image reading apparatus in a digital video camera, a facsimile, a copier, a scanner and the like, a projector apparatus and the like.

It is to be understood that although the present invention has been described with regard to preferable embodiments thereof, various other embodiments and variants may occur to those skilled in the art, which are within the scope and spirit of the invention, and such other embodiments and variants are intended to be covered by the following claims.

Obviously, numerous modifications and variations of the present invention are possible in light of the above teachings. It is therefore to be understood that within the scope of the appended claims, the invention may be practiced otherwise than as specifically described herein.

What is claimed is:

1. A light emitting device comprising:
    a first light emitting element having a first front surface, a first back surface opposite to the first front surface in a front-back direction of the light emitting device, and a first lateral surface connecting the first front surface and the first back surface;
    a second light emitting element having a second front surface, a second back surface opposite to the second front surface in the front-back direction, and a second lateral surface connecting the second front surface and the second back surface;

a substrate having a substrate front surface substantially perpendicular to the front-back direction, the substrate comprising:

a first land which is provided in the substrate front surface and on which the first light emitting element is mounted in a flip-chip configuration such that the first back surface faces the first land in the front-back direction;

a second land which is provided in the substrate front surface and on which the second light emitting element is mounted in a flip-chip configuration such that the second back surface faces the second land in the front-back direction, the first land and the second land being arranged in an array direction on the substrate front surface; and an intermediate wiring provided between the first land and the second land in the substrate front surface to electrically connect the first land and the second land; and a light reflective covering member provided on the substrate front surface to cover the first lateral surface of the first light emitting element and the second lateral surface of the second light emitting element, the light reflective covering member including an external surface opposite to the substrate front surface in the front-back direction and a first recess provided between the first light emitting element and the second light emitting element, the first recess having a recess opening on the external surface and a recess bottom opposite to the recess opening in the front-back direction, the recess bottom being positioned between the intermediate wiring and both of the first front surface of the first light emitting element and the second front surface of the second light emitting element in the front-back direction.

2. The light emitting device according to claim 1, wherein the light reflective covering member has an internal surface which is opposite to the external surface and which faces the substrate front surface in the front-back direction, a third lateral surface connecting the external surface and the internal surface, and a fourth lateral surface which connects the external surface and the internal surface and which is opposite to the third lateral surface in a transverse direction perpendicular to the array direction and the first direction, and wherein the first recess reaches at least one of the third lateral surface and the fourth lateral surface viewed in the front-back direction.

3. The light emitting device according to claim 1, wherein the light reflective covering member has an elongated shape in the array direction.

4. The light emitting device according to claim 1, wherein the substrate includes a base member having a linear expansion coefficient of 15 ppm/° C. or less.

5. The light emitting device according to claim 1, wherein the substrate includes a substrate back surface opposite to the substrate front surface in the front-back direction, and wherein the substrate has a second recess which is provided in the substrate back surface and which is opposite to the first recess in the front-back direction.

6. The light emitting device according to claim 1, wherein the light reflective covering member has an internal surface which is opposite to the external surface and which faces the substrate front surface in the front-back direction, a third lateral surface connecting the external surface and the internal surface, and a fourth lateral surface connecting the external surface and the internal surface, the fourth lateral surface being opposite to the third lateral surface in a transverse direction perpendicular to the array direction and the first direction, wherein the substrate has a substrate back surface opposite to the substrate front surface in the front-back direction, a fifth lateral surface connecting the substrate front surface and the substrate back surface, the fifth lateral surface being connected to the third lateral surface, and a sixth lateral surface connecting the substrate front surface and the substrate back surface, the sixth lateral surface being opposite to the fifth lateral surface in the transverse direction, the sixth lateral surface being connected to the fourth lateral surface, and wherein the third lateral surface is inclined toward the fourth lateral surface from the fifth lateral surface and the fourth lateral surface is inclined toward the third lateral surface from the sixth lateral surface.

7. The light emitting device according to claim 1, further comprising:

a first light-transmissive member provided on the first front surface of the first light emitting element, the first light-transmissive member containing a wavelength converting material to absorb light emitted from the first light emitting element and to emit light; and a second light-transmissive member provided on the second front surface of the second light emitting element, the second light-transmissive member containing a wavelength converting material to absorb light emitted from the second light emitting element and to emit light, wherein the light reflective covering member covers a lateral surface of the first light-transmissive member and a lateral surface of the second light-transmissive member.

8. The light emitting device according to claim 7, wherein the wavelength converting material contains a manganese activated fluoride fluorescent material.

9. The light emitting device according to claim 1, wherein electricity is to be supplied to the first light emitting element and the second light emitting element via the intermediate wiring.

* * * * *